United States Patent [19]

Megerle et al.

[11] Patent Number: 5,340,411
[45] Date of Patent: Aug. 23, 1994

[54] SURFACE TREATMENT METHOD FOR FATIGUE-RESISTANT SOLDER

[75] Inventors: Clifford A. Megerle, Thousand Oaks; Boon Wong, Canoga Park, both of Calif.

[73] Assignee: Hughes Aircraft Company, Los Angeles, Calif.

[21] Appl. No.: 134,720

[22] Filed: Oct. 12, 1993

[51] Int. Cl.$^5$ .............................................. B23K 35/34
[52] U.S. Cl. ........................................ 148/26; 148/23
[58] Field of Search ................................... 148/23, 26

[56] References Cited

U.S. PATENT DOCUMENTS

| | | | |
|---|---|---|---|
| 139,297 | 5/1873 | Cox | 148/26 |
| 803,802 | 11/1905 | Ball | 148/26 |

*Primary Examiner*—Peter D. Rosenberg
*Attorney, Agent, or Firm*—M. E. Lachman; M. W. Sales; W. K. Denson-Low

[57] ABSTRACT

The surface of a fatigue-resistant eutectic or near-eutectic lead/tin solder containing at least one doping element of cadmium, indium, and antimony is treated with an aqueous solution of an acidic chloride or acidic nitrate. The surface treatment method of the present invention removes, or substantially reduces, the presence of any cadmium, indium, and/or antimony, as well as the oxides of tin and lead, leaving a surface that is substantially tin and lead. The resulting treatment renders the solder compatible with mildly reducing fluxes of low activity and improves the wettability of the solder.

13 Claims, 4 Drawing Sheets

SURFACE TREATMENT METHOD FOR FATIGUE-RESISTANT SOLDER

BACKGROUND OF THE INVENTION

1. Field of the Invention

The present invention relates to tin-lead eutectic solders, and, more particularly, to improving the fatigue resistance of such solders.

2. Description of Related Art

Eutectic and near-eutectic lead-tin solder alloys are used to provide solder joints in a wide variety of electronic devices. In addition to providing electrical connections, the solder joint provides a vital mechanical link between electronic devices and connectors.

During operation, many electrical devices are subjected to vibration and continual changes in temperature. Many times, the coefficient of thermal expansion of each the various materials at and around the solder joint is different. As a result, the continual changes in temperature cause the solder joint to be continually subjected to varying degrees of stress and strain. The solder joint may also undergo continual stress due to vibrations and other forces exerted against the joint.

It would be desirable to provide solder joints which are structurally strong and resist fatigue due to mechanical or thermal stress and strain. Such fatigue-resistant solder would be especially well-suited for used in electronic equipment which is subjected to extreme thermal fluctuations and mechanical load. Further, fatigue-resistant solder would be desirable for use in electronic devices where a long service life is required.

Fatigue-resistant solders are disclosed and claimed in application Ser. No. 08/015,875, filed Feb. 10, 1993, entitled "Improved Fatigue-Resistant Eutectic Solder", and assigned to the same assignee as the present application. The fatigue-resistant solders are lead--tin eutectic solders free of silver and gold and doped with less than 1 weight percent of at least one dopant selected from the group consisting of cadmium, indium, and antimony. The doped solder has improved fatigue resistance over undoped solders.

Continued investigations with these fatigue-resistant solders show that some desirable flux materials cannot be used to improve wetting and diminish the tendency of the solder to form balls. The reason for this is that the surfaces of the solder particles are enriched in the oxides of the Cd, In, and Sb dopants, and these oxides inhibit wetting of the metallic surfaces to be soldered. They also inhibit the fusing of solder particles into a single, massive solder joint.

Specifically, experiments by the present inventors on Cd- and In-containing solders show that these dopants tend to segregate at the surface of the solder and tend to oxidize. Their experiments also suggest that some less active fluxes are not active enough to chemically reduce the oxides of the cadmium and indium dopant species to their metallic states. As a consequence, when solder pastes made by mixing particles of these solder alloys into such fluxes are reflowed, the oxides of these elements are present on the surface of the solder particles and may prevent all of the solder particles from fusing into the solder joint. Instead, small balls of solder may form adjacent to the solder joint. These solder balls may become electrical shorts if they lodge between conductors that are at different electrical potentials. Furthermore, these surface oxides may hinder the molten solder from wetting the metal surfaces to be joined by lowering the surface-free energy of the solder surface, and thereby reducing the free energy difference between the wetted and non-wetted states that represents the driving force for wetting. Furthermore, unfused, oxide-coated solder particles in the solder joint are latent defects that may lead to premature failure of the solder joint.

One solution to this problem is to use more highly active solder fluxes, such as rosin-activated (RA), or fluxes containing chlorides, to break down these oxides during solder reflow. This is not always desirable, however, since these highly active fluxes are corrosive, and must be thoroughly removed from the printed wiring assemblies after soldering. Residual flux may diminish the lifetimes of printed wiring assemblies and other assemblies made with these solder fluxes. For this reason, the U.S. military and some commercial manufacturers of high reliability electronics prohibit or discourage the use of such highly active fluxes.

Thus, a need exists for improving the wetting of fatigue-resistant solders without the use of highly active fluxes or corrosive chemicals.

SUMMARY OF THE INVENTION

In accordance with the invention, a method is provided for treating the surface of fatigue-resistant eutectic and near-eutectic lead/tin solder containing at least one doping element of cadmium, indium, and antimony. The resulting treatment renders the solder compatible with mildly reducing fluxes of low activity.

The surface treatment method of the present invention comprises exposing the surface of the solder to an acidic solution of a chloride or a nitrate for a period of time sufficient to remove, or substantially reduce, the presence of any cadmium, indium, and/or antimony, as well as the oxides of tin and lead, leaving a surface that is substantially tin and lead.

The surface treatment disclosed herein diminishes the amount of cadmium (Cd), in both its oxidized and reduced forms, on the solder surface. The surface treatment of the present invention also diminishes the amount of indium (In) on the surface of an indium-containing solder and the amount of antimony (Sb) on the surface of an antimony-containing solder. The surface treatment further diminishes the extent of oxidation of tin (Sn) and lead (Pb), the major constituents of the solder, leaving a principally metallic and easily wetting and reflowable surface that comprises tin and lead.

When the surface treatment of the present invention is applied to solder powder, a paste made from the powder will better wet metallic surfaces, such as copper and solder-plated printed wiring circuit traces, component leads, and leadless chip carrier castellations.

The surface treatment also minimizes solder ball formation during reflow of solder pastes. Solder particles fuse during reflow when the molten metallic surfaces touch each other. If the particle surfaces are heavily oxidized, however, the oxide layers serve as a physical and chemical barrier to the desired fusion. Under these conditions, small solder balls can form. The surface treatment of the present invention reduces surface oxidation to enhance fusion solder particles during reflow.

BRIEF DESCRIPTION OF THE DRAWINGS

FIG. 1 - untreated sample of fatigue-resistant solder containing cadmium and indium dopants;

FIG. 2 - the same sample as FIG. 1, but after removal of 1,000 Å by ion bombardment;

FIG. 3 - a sample having the same composition as in FIG. 1, following ultrasonic cleaning in isopropyl alcohol, and not ion bombarded;

FIG. 4 - the same sample as in FIG. 3, but after removal of 15 Å by ion bombardment;

FIG. 5 - a sample having the same composition as in FIG. 1, following treatment in accordance with an embodiment of the present invention and after removal of 30 Å by ion bombardment;

FIG. 6 - the same sample as in FIG. 5, but after removal of a large amount of material by ion bombardment;

FIG. 7 - a sample having the same composition as in FIG. 1, following treatment in accordance with another embodiment of the present invention and after removal of 15 Å by ion bombardment;

FIG. 8 - the same sample as in FIG. 7, but after removal of a large amount of material by ion bombardment;

FIG. 9 - a sample having the same composition as in FIG. 1, following treatment in accordance with yet another embodiment of the present invention and after removal of 15 Å by ion bombardment; and FIG. 10 - the same sample as in FIG. 9, but after removal of a large amount of material by ion bombardment.

DESCRIPTION OF THE PREFERRED EMBODIMENTS

Figure 1:
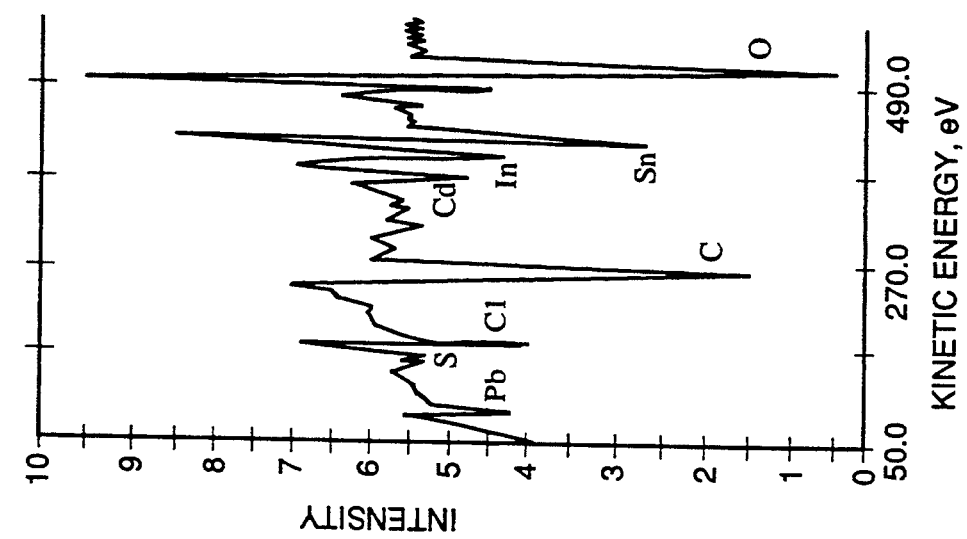
FIGS. 1-10, on coordinates of dN/dV, where N is the number of counts with respect to energy, and kinetic energy (in electron volts, eV), are Auger spectra of the following surfaces.

The purpose of solder flux is to chemically reduce and remove the oxide that coats the surface of metallic solder, and also the oxides that coat the metallic surfaces to be joined, so that the solder can wet itself and these metallic surfaces in the process of forming the solder joint. Mildly active fluxes are desirable because they possess the minimum of chemical activity needed to chemically reduce the oxides of Sn and Pb, but are not sufficiently active to rapidly corrode other metal surfaces.

The fatigue-resistant solder alloys contain more than just tin (Sn) and lead (Pb). They contain at least one of the following dopant species: cadmium (Cd), indium (In), and antimony (Sb). The total concentration of the dopant species does not exceed about 1 weight percent (wt%) of the solder composition, and preferably ranges from about 0.1 to 0.8 wt%.

The fatigue-resistant solder alloys employed in the practice of the invention preferably comprise eutectic (63 wt% tin, balance lead) and near-eutectic tin-lead alloys. As used herein, the term "near-eutectic" is intended to include those tin-lead solders wherein the weight percent of tin and lead are about 3 wt% higher or lower than the 63/37 wt% eutectic mixture. Further as used herein, the term "eutectic" is intended to include "near-eutectic" compositions, unless otherwise specified.

In accordance with the present invention, a method is provided for treating the surface of the solder so as to reduce the oxides of cadmium, indium, and antimony to their metallic states, and/or to diminish the amounts of these dopant species at the solder surface. Since it is often intended that the solder be used as a paste, comprising solder powder and one or more mildly active fluxes, the treatment of the present invention can be done after the manufacture of the solder powder. Sealing the solder powder in closed containers under an inert atmosphere after treatment will extend the shelf life of the powder by minimizing the possibility of reoxidation. Alternatively, the surface treatment can be done immediately prior to mixing the solder particles with the mildly active fluxes to form the solder paste. The solder fluxes will coat the surfaces of the solder particles, preventing extensive reoxidation of the surfaces, giving the pastes made from the powders a good shelf life.

The size of the powder treated in accordance with the present invention is immaterial, and may be on the order of 10 to 75 μm in size and may range up to larger sizes, such as solder balls or spheres used for interconnections, wire preforms, and the like.

The surface treatment of the present invention is done by immersing the solder powder in an etching solution, then removing the solution by pouring the solution and the solder powder through a filter, and rinsing in water using ordinary methods. Any other method of subjecting the sample to the etching solution and thoroughly removing the etching solution may also be employed. These methods are well-known to those skilled in the art.

In the experiments performed during reduction of the present invention to practice, small solder ingots were used instead of powder; this permitted performing Auger analyses of the surfaces of the solder, and thereby determining the effect of surface treatment of the present invention. The ingots were immersed in the solutions, then rinsed with deionized water, cleaned ultrasonically in isopropyl alcohol, and dried prior to testing. The tests that were performed on these ingots are the Auger analyses reported below.

FIGS. 1, 2, 3, and 4 illustrate the problem solved by the present invention. FIG. 1 is an Auger spectrum of the surface of an untreated sample of fatigue-resistant solder containing 0.4% cadmium (Cd) and 0.4% indium (In), the balance being a near-eutectic alloy of tin (Sn) and lead (Pb). This Auger spectrum, taken after removal of approximately 15 Angstroms (Å) of material from the surface by ion bombardment to clean off some of the atmospheric contamination, shows a highly oxidized surface strongly enriched in Cd with some In, but little evidence of Sn or Pb. Other surface contaminants are also present.

Figure 2:
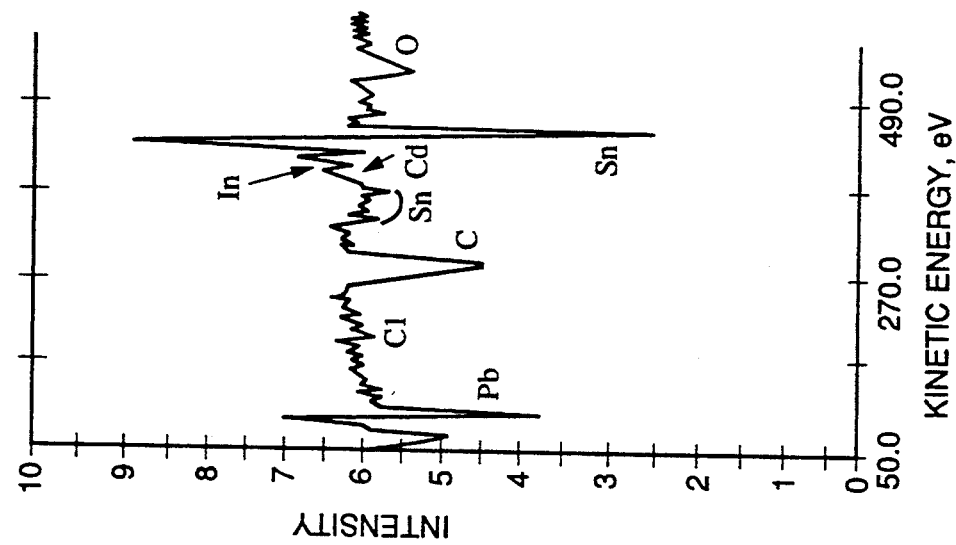

FIG. 2 shows the same sample as in FIG. 1 after the removal of 1,000 Å of materials by ion bombardment. The primary species present at the surface are Sn and Pb, with Cd and In being present at very low levels, as expected from their low concentration in the bulk of the solder. This chemistry is characteristic of the bulk of the solder, as opposed to the previous chemistry which is characteristic of the surface that forms when molten solder cools. This demonstrates the surface enrichment that was present in FIG. 1, and will be seen in FIG. 3. The other surface contaminants present in these two spectra are incidental to the wettability problem.

Figure 3:
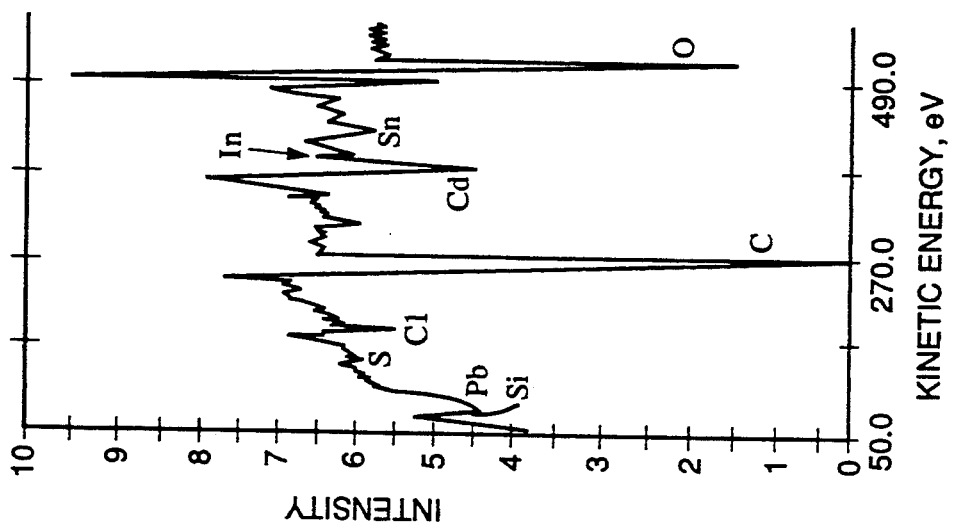

FIG. 3 shows the Auger spectrum of a similar sample, which had been cleaned ultrasonically in isopropyl alcohol (IPA) but had not been ion bombarded. While some Cd oxides obviously spalled off during the ultrasonic agitation, the surface is still strongly enriched in Cd and In, and is strongly oxidized. This supports the conclusions drawn from FIG. 1.

Figure 4:
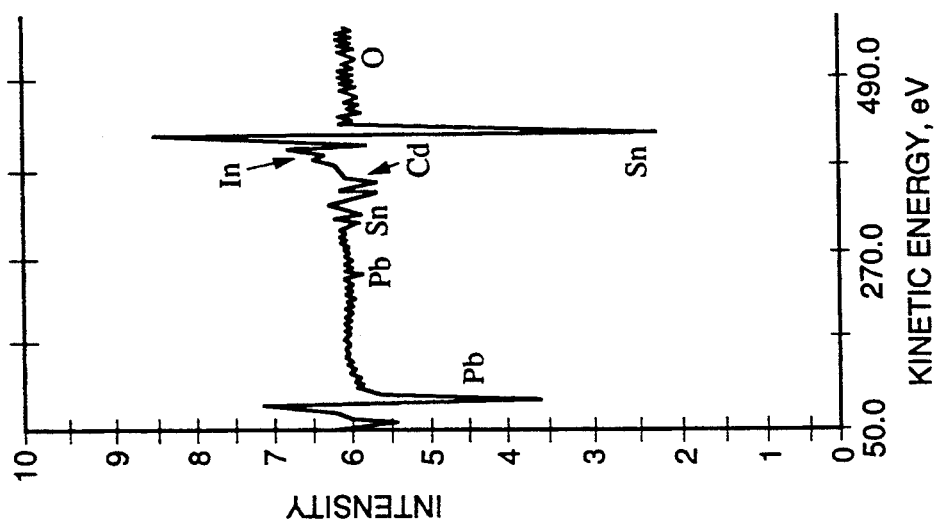

FIG. 4 shows the same sample used in FIG. 3 after 15 Å of material had been removed by ion bombardment. The same Cd and In enrichment, and the same strongly oxidized surface are observed.

The spectra depicted in FIGS. 1–4 and described above show the troublesome, highly oxidized surface enriched in Cd and In that degrades wetting and causes solder ball formation. The spectra depicted in FIGS. 5–10 and described below were made from samples that were treated in accordance with the present invention with various solutions designed to remove surface oxides and/or diminish dopant concentrations at the solder surfaces.

Figure 5:
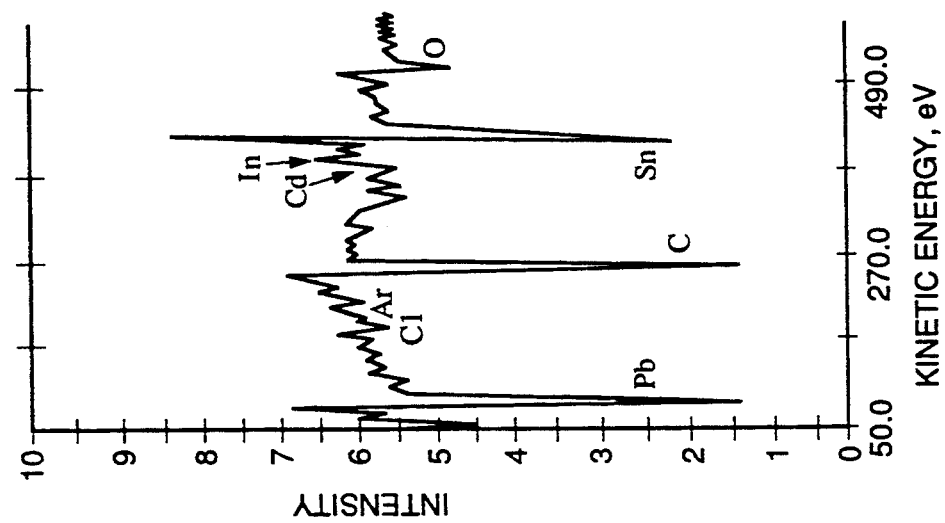

One successful surface treatment was to soak the solder for 2 hours in a 1-molar solution of hydrochloric acid (HCl) at room temperature. FIG. 5 shows the surface of such a sample after 30 Å of material had been removed by ion bombardment. The surface is only slightly oxidized and is not enriched in Cd or In.

Figure 6:
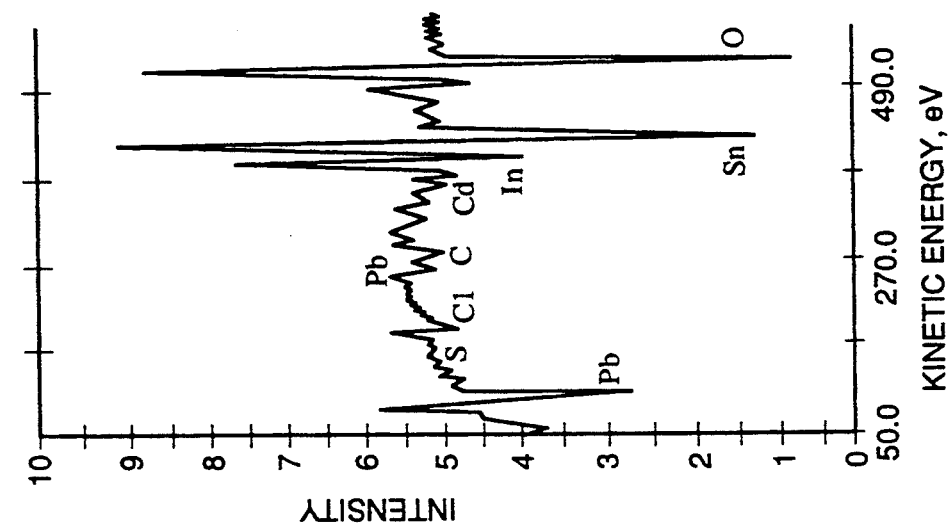

FIG. 6 shows the surface of the same sample as in FIG. 5 after removal of several thousand Ångstroms of material by ion bombardment. Aside from removal of a small amount of oxide, surface carbon, and chlorine, the spectrum is the same as that of FIG. 5. Clearly, the HCl treatment was effective at removing Cd and In oxides and metals from the surface of the sample. HCl also tends to preferentially dissolve Sn, as compared to Pb. This is evident from the change in the peak-to-peak heights of the Sn and Pb peaks.

Figure 7:
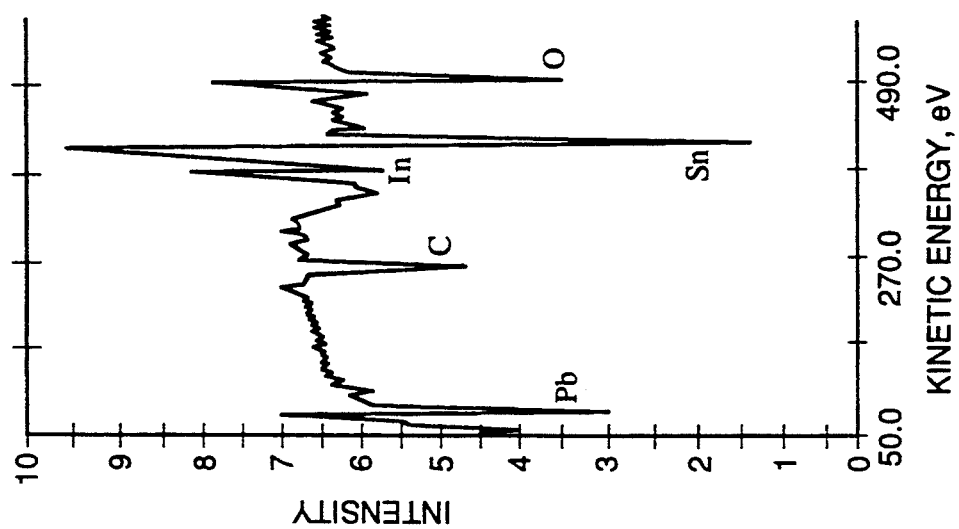

A second successful surface treatment was to soak the solder in a saturated solution of ammonium chloride for 2 hours. FIG. 7 is an Auger spectrum of the surface of this sample after 15 Å of material had been removed by ion bombardment. The sample is seen to be partially oxidized and that it is enriched in In, but it is depleted of Cd.

Figure 8:
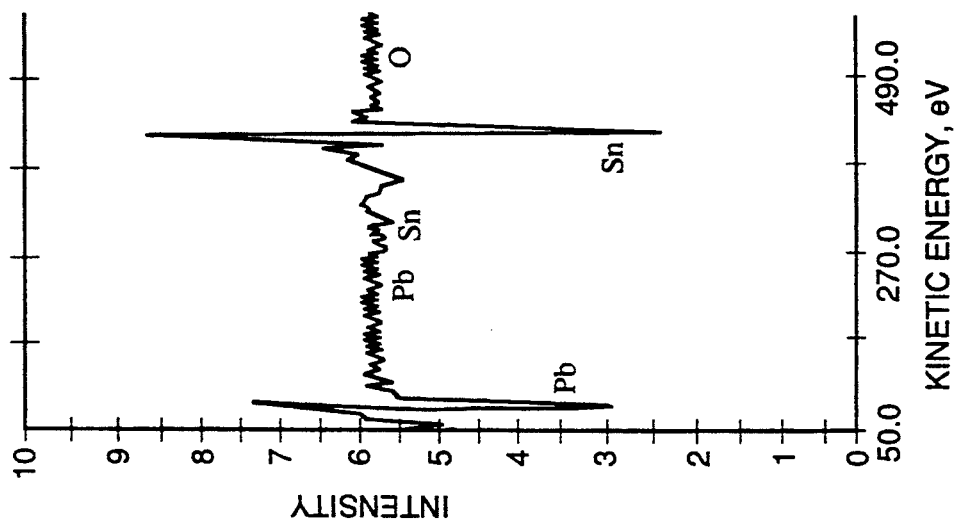

FIG. 8 shows the Auger spectrum of the surface of the same sample as in FIG. 7 after removal of several thousand Ångstroms of material by ion bombardment. This bulk-like composition is similar to those seen in FIGS. 2 and 6 above. Clearly, ammonium chloride was successful at removing cadmium oxide and cadmium from the surface. It also somewhat diminished the overall degree of oxidation of the surface, but it did not diminish the amount of In on the surface.

Figure 9:
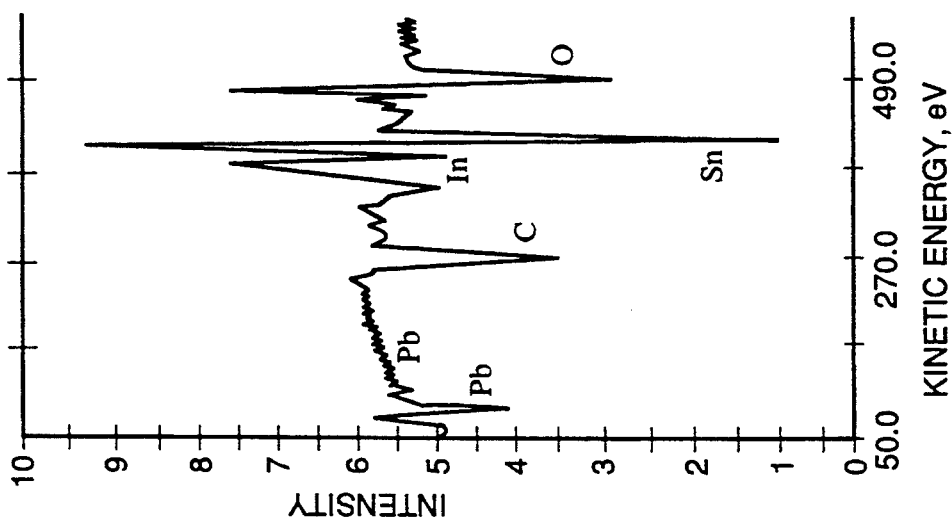

A third successful surface treatment was to soak the solder in a saturated solution of ammonium nitrate for 2 hours. FIG. 9 is an Auger spectrum of the surface of this sample after 15 Å of material had been removed by ion bombardment. The Auger spectrum is nearly identical to the Auger spectrum of FIG. 7 above, which is the surface that had been treated with ammonium chloride.

Figure 10:
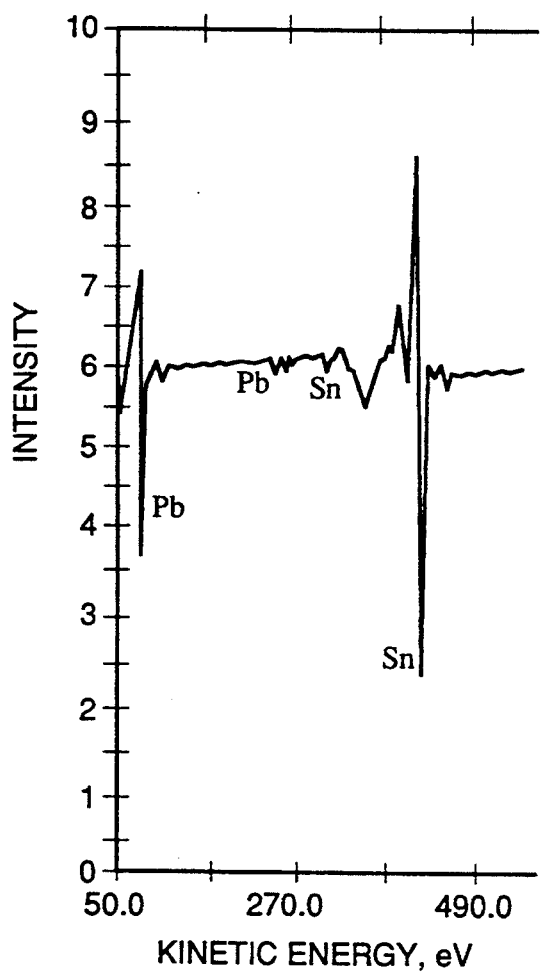

FIG. 10 shows the Auger spectrum of the surface of the same sample as in FIG. 9 after removal of several thousand Ångstroms of material by ion bombardment. This bulk-like composition is similar to those seen in FIGS. 2, 6, and 8 above. Clearly, ammonium nitrate was successful at removing cadmium oxide and cadmium from the surface. It also somewhat diminished the overall degree of oxidation of the surface, but it did not diminish the amount of In on the surface.

From these experiments, it is clear that 1 molar HCl is the most effective in removing both the oxides of cadmium and indium, and the metallic elements themselves from the surface of the solder. Solubility data on antimony and its oxides also indicate that it would also be removed by HCl. Ammonium chloride and ammonium nitrate are equally effective at reducing surface oxidation on the solder and removing cadmium oxides and metallic cadmium from the surface of solder. Indium, either oxidized or partially reduced, remains on the solder surface after this treatment. Any of these three treatments are expected to improve the compatibility of cadmium-, indium-, and/or antimony-containing, fatigue-resistant solder with RA and RMA fluxes.

Other variants of these surface treatments are also useful in the practice of the present invention, including shorter times in the solutions, and solutions of different concentration than those used here.

The etching solutions employed in the practice of the present invention are characterized as aqueous solutions of acidic chlorides and nitrates, with the pH of the solution being less than 6. The cation of these solutions is preferably selected from the group consisting of hydrogen and ammonium.

The concentration of the etching solutions may range from about 0.1 Molar to saturation (in the case of solid salts, such as ammonium chloride and ammonium nitrate) or from about 0.1 to 12 Molar (in the case of gaseous salts, such as hydrogen chloride).

The solder is exposed to the etching solution for a period of time sufficient to remove the oxides and the metallic elements (other than tin or lead) from the surface. Typically, at least about 30 seconds will be required. However, the actual time employed depends on the temperature of the etching solution and whether the solution is flowing or stationary. High temperature, flowing solutions will require less etching time than cooler, stationary solutions.

It should be noted that fluoride and sulfate salts are not effective in treating the surface of Sn-Pb solders doped with Cd, In, and/or Sb to improve their wettability. Fluorine tends to react with lead to form poorly soluble fluoride salts of lead, while sulfate tends to react with lead to form poorly soluble sulfate salts of lead.

Thus, there has been disclosed a method of treating tin-lead solders doped with at least one dopant element of cadmium, indium, and antimony to improve the wettability of these fatigue-resistant solders. It will be appreciated by those skilled in this art that various changes and modifications of an obvious nature may be made without departing from the scope of the present invention, as defined by the appended claims.

What is claimed is:

1. A method for treating a eutectic tin-lead solder doped with about 0.1 to 1 wt% of at least one dopant selected from the group consisting of cadmium, indium, and antimony prior to exposure of said solder to solder flux, comprising immersing said solder in an etching solution consisting essentially of an aqueous solution of an acidic chloride or an acidic nitrate for a period of time sufficient to at least substantially reduce the presence of any cadmium, indium, or antimony, as well as the oxides of tin and lead, leaving a surface that is substantially tin and lead.

2. The method of claim 1 wherein said etching solution has a pH less than about 6.

3. The method of claim 1 wherein said acidic chloride or acidic nitrate includes a cation selected from the group consisting of hydrogen and ammonium.

4. The method of claim 3 wherein said etching solution consists essentially of an aqueous solution of hydrogen chloride, ammonium chloride, or ammonium nitrate.

5. The method of claim 1 wherein said acidic chloride or acidic nitrate is a solid.

6. The method of claim 5 wherein said etching solution has a concentration of said acidic chloride or acidic nitrate in water ranging from about 0.1 Molar to saturation.

7. The method of claim 1 wherein said acidic chloride or acidic nitrate is a gas.

8. The method of claim 7 wherein said etching solution has a concentration of said acidic chloride or acidic nitrate in water ranging from about 0.1 to 12 Molar.

9. The method of claim 9 wherein said solder is immersed in said etching solution for a period of time ranging from about 30 seconds to 2 hours.

10. The method of claim 1 wherein said solder is of a form comprising powder, balls, or wire.

11. The method of claim 10 wherein said powder has an average particle size ranging from about 10 to 75 $\mu$m.

12. The method of claim 11 wherein said solder is first formed as said powder, is then immersed in said etching solution, is sealed in closed containers under an inert atmosphere, and subsequently mixed with one or more mildly active fluxes to form a solder paste.

13. The method of claim 11 wherein said solder is first formed as said powder, is then immersed in said etching solution, and immediately mixed with one or more mildly active fluxes to form a solder paste.

* * * * *